(12) United States Patent
Ramakrishnan et al.

(10) Patent No.: US 7,127,566 B2
(45) Date of Patent: Oct. 24, 2006

(54) SYNCHRONIZING MEMORY COPY OPERATIONS WITH MEMORY ACCESSES

(75) Inventors: Siva Ramakrishnan, Beaverton, OR (US); Ioannis Schoinas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 286 days.

(21) Appl. No.: 10/741,721

(22) Filed: Dec. 18, 2003

(65) Prior Publication Data

US 2005/0135176 A1     Jun. 23, 2005

(51) Int. Cl.
    G06F 13/16    (2006.01)
(52) U.S. Cl. ........................................... 711/152
(58) Field of Classification Search ................ 711/150, 711/152, 168
    See application file for complete search history.

(56) References Cited

U.S. PATENT DOCUMENTS

| | | | | |
|---|---|---|---|---|
| 5,701,437 A | * | 12/1997 | Kinjo et al. | 711/162 |
| 5,742,831 A | * | 4/1998 | Creta | 710/244 |
| 5,832,304 A | * | 11/1998 | Bauman et al. | 710/40 |
| 5,915,264 A | * | 6/1999 | White et al. | 711/168 |
| 6,347,362 B1 | | 2/2002 | Schoinas et al. | |
| 6,662,276 B1 | | 12/2003 | Schoinas | |
| 6,971,098 B1 | | 11/2005 | Khare et al. | |
| 2005/0114601 A1 | | 5/2005 | Ramakrishnan | |
| 2005/0125580 A1 | | 6/2005 | Madukkarumukumana et al. | |
| 2005/0132365 A1 | | 6/2005 | Madukkarumukumana et al. | |
| 2005/0138304 A1 | | 6/2005 | Ramakrishnan et al. | |
| 2005/0188064 A1 | | 8/2005 | Schoinas | |
| 2005/0204193 A1 | | 9/2005 | Mannava et al. | |
| 2005/0273602 A1 | | 12/2005 | Wilson et al. | |
| 2005/0273633 A1 | | 12/2005 | Wilcox et al. | |
| 2005/0273635 A1 | | 12/2005 | Wilcox et al. | |

OTHER PUBLICATIONS

U.S. Appl. No. 10/859,656; Title: Packet Exchange For Controlling System Power Modes; Inventor: Jeffrey Wilcox; filed Jun. 2, 2004.
U.S. Appl. No. 10/956,630; Title: Fault Processing for Direct Memory Access Address Translation; Inventor: Rajesh Madukkarumukumana; filed Sep. 30, 2004.
U.S. Appl. No. 10/956,206; Title: Caching Support for Direct Memory Access Address Translation; Inventor: Ioannis Schoinas; filed Sep. 30, 2004.

(Continued)

Primary Examiner—Kevin L. Ellis
(74) Attorney, Agent, or Firm—Rob D. Anderson (57) ABSTRACT

In some embodiments, a comparator compares an incoming memory address with a memory address currently being copied by a memory copy operation. A holding buffer holds the incoming address prior to forwarding it to a memory read/write queue if the incoming memory address is the same as the memory address currently being copied by the memory copy operation, forwards the buffered incoming memory address to the read/write queue once the memory copy operation for the memory address currently being copied has finished. Other embodiments are described and claimed.

12 Claims, 4 Drawing Sheets

OTHER PUBLICATIONS

U.S. Appl. No. 10/956,198; Title: Address Translation for Input/Output Devices Using Hierarchical Translation Tables; Inventor: Ioannis Schoinas; filed Sep. 30, 2004.

U.S. Appl. No. 10/957,306; Title: Performance Enhancement of Address Translation Using Translation Tables Covering Large Address Spaces; Inventor: Ioannis Schoinas; filed Sep. 30, 2004.

U.S. Appl. No. 11/011,300; Title: Method, System, and Apparatus for Dynamic Reconfiguration of Resources; Inventor: Mani Ayyar; filed Dec. 13, 2004.

U.S. Appl. No. 11/011,801; Title: Method, System, and Apparatus for System Level Initialization; Inventor: Mani Ayyar; filed Dec. 13, 2004.

U.S. Appl. No. 11/026,314; Title: Direct Memory Access (DMA) Address Translation Between Peer Input/Output (I/O) Devices; Inventor: Rajesh Madukkarumukumana; filed Dec. 29, 2004.

U.S. Appl. No. 11/321,213; Title: Firm Partitioning in a System with a Point-to-Point Interconnect; Inventor: Ioannis Schoinas; filed Dec. 28, 2005.

U.S. Appl. No. 11/284,520; Title: In Band Configuration Agent For Link Based Computing System; Inventor: Eric Delano; filed Dec. 21, 2005.

U.S. Appl. No. 11/320,923; Title: Conditional and Vectored System Management Interrupts; Inventor: Mani Ayyar; filed Dec. 28, 2005.

* cited by examiner

SYNCHRONIZING MEMORY COPY OPERATIONS WITH MEMORY ACCESSES

RELATED APPLICATION

This application is related to a U.S. patent application Ser. No. 10/741,722 entitled "PERFORMING MEMORY RAS OPERATIONS OVER A POINT-TO-POINT INTERCONNECT" to inventors Siva Ramakrishnan and Ioannis Schoinas and filed on Dec. 18, 2003.

TECHNICAL FIELD

The inventions generally relate to synchronizing memory copy operations with memory accesses.

BACKGROUND

Memory Reliability Availability and Serviceability (Memory RAS) features can include features such as memory mirroring, memory sparing, memory RAID (Redundant Array of Independent Disks), etc. Memory RAS features are increasingly becoming more important in various computer related market segments such as server market segments, including low end server market segments. Memory RAS features help server application availability by providing mechanisms to recover and/or reconstruct memory data without bringing the system down in cases where erroneous data is supplied by the memory devices. Such memory RAS features need to be enabled in server platforms without severely impacting the performance of the system.

In memory RAS flows such as memory sparing, memory mirroring, memory hot plug, etc. there is a need to copy memory data from one memory device such as a Dual In-Line Memory Module (DIMM) to another spare memory device such as a DIMM without interfering with regular memory accesses. Such RAS memory operations (flows) occur at the same time as regular memory accesses. Using software copy schemes can reduce the cost of implementing the memory RAS flows, but the copy process itself must be atomic in order to guarantee data integrity. As is known in the art, the atomicity of a process means that the process must complete without any interruptions. This means that during an atomic copy process the read from one device and the write to the spare device must happen without any interruptions.

One way to ensure the atomicity of a software copy process is to use software locking/fencing operations. However, there are problems with using such operations. For example, locking/fencing operations are not applicable to all memory regions such as the Write Combine (WC) memory region. When copying data from such a region a memory access to the same address can occur between the read/write operations and potentially corrupt the data. Therefore, it would be beneficial to synchronize the copy process with other memory accesses, particularly in a system with a point-to-point (unordered) interconnect.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to synchronizing memory copy operations with memory accesses.

In some embodiments, a comparator compares an incoming memory address with a memory address currently being copied by a memory copy operation. A holding buffer holds the incoming address prior to forwarding it to a memory read/write queue if the incoming memory address is the same as the memory address currently being copied by the memory copy operation, forwards the buffered incoming memory address to the read/write queue once the memory copy operation for the memory address currently being copied has finished.

In some embodiments an incoming memory address is compared with a memory address currently being copied by a memory copy operation. The incoming address is held prior to forwarding it to a memory read/write queue if the incoming memory address is the same as the memory address currently being copied by the memory copy operation. The incoming memory address is forwarded to the read/write queue once the memory copy operation for the memory address currently being copied has finished.

In some embodiments memory accesses are synchronized with software controlled data copy for memory RAS operations (for example, memory mirroring, memory sparing, memory hot plug, memory migration, etc.) In some embodiments a hardware implementation is used to synchronize a memory copy process performed using software and other concurrent memory accesses.

Figure 1:
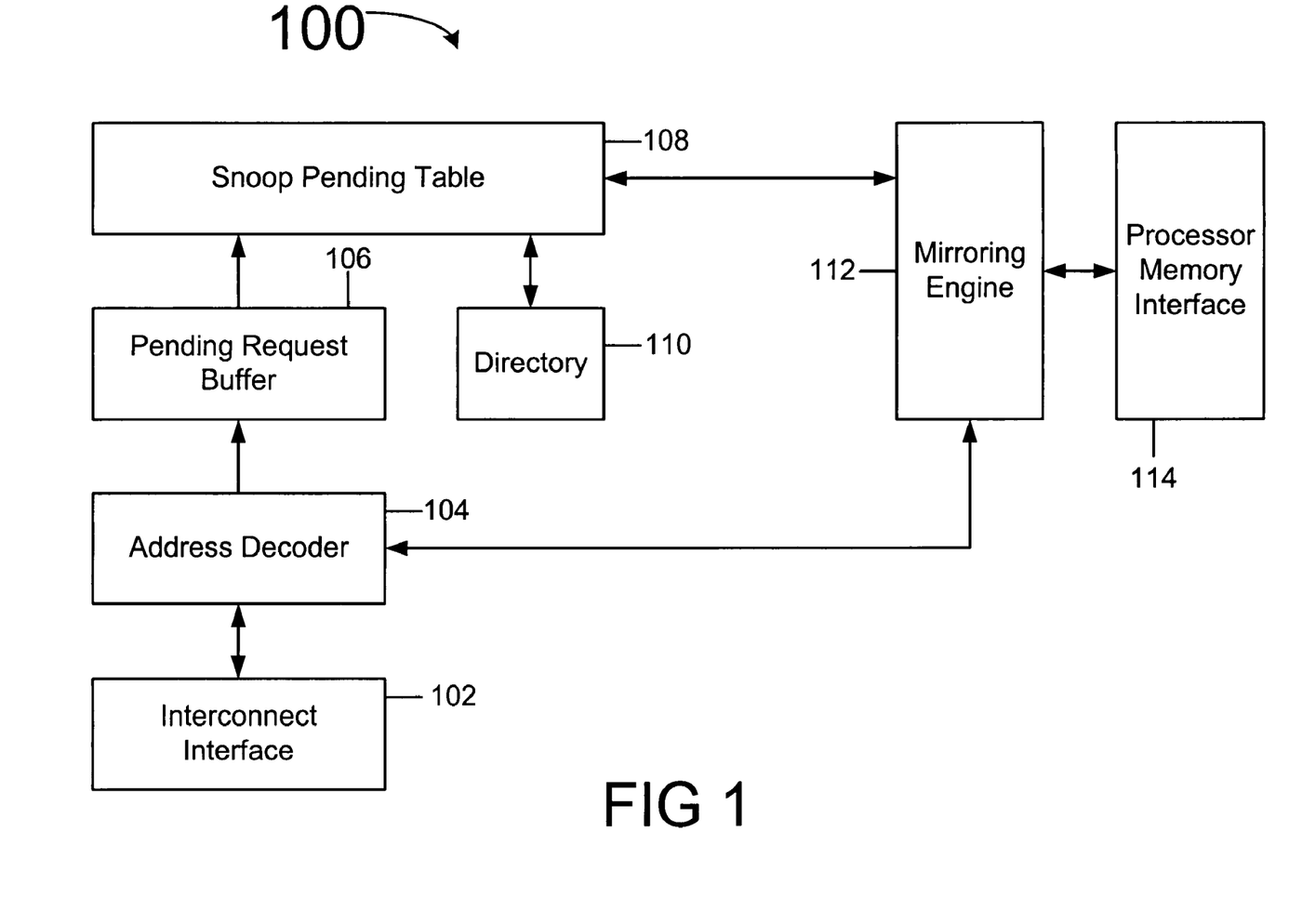
FIG. 1 is a block diagram representation illustrating a memory RAS arrangement according to some embodiments of the inventions.

FIG. 1 illustrates a memory RAS apparatus 100 according to some embodiments. Memory RAS apparatus 100 includes an interconnect interface 102, an address decoder 104, a pending request buffer (PRB) 106, a snoop pending table (SPT) 108, a directory 110, a mirroring engine (and/or a mirror write pending table, MWPT) 112, and a processor memory interface (PMI) 114. In some embodiments interconnect interface 102, address decoder 104, priority request buffer 106, snoop pending table 108 and directory 110 are included within a processor or CPU and mirroring engine 112 and processor memory interface 114 are included in a memory controller. In some embodiments the memory controller is an external memory controller. In some embodiments the memory controller is an integrated memory controller (integrated with the processor). In some embodiments mirroring engine 112 is included within the processor die.

In some embodiments a point-to-point coherent interconnect is used as a system interconnect fabric connecting distributed memory RAS apparatus 100 to other distributed devices (for example, to one or more other processors, memory controllers, memory RAS apparatus, etc.) System components connect to the system interconnect fabric using ports such as the interconnect interface 102.

Interconnect interface 102 may be a port over which transactions such as read/write transactions are used to access memory and/or I/O data. The read/write transactions include the address to which the read/write operation needs to be performed. Address decoder 104 determines the region to which the address belongs and forwards the transactions accordingly. Transactions decoded by the address decoder 104 are buffered into the pending request buffer 106 for processing by a coherence engine such as snoop pending table 108.

Snoop pending table 108 initiates the necessary coherence transactions such as probing all the caches of the system (for example, using a Snoopy protocol), or probing selected caches in the system based on a directory entry for that address in directory 110 using a directory based protocol. The snoop pending table 108 is also responsible for initiating memory accesses through the processor memory interface 114 based on the snoop responses from the various caches throughout the system. After receiving all of the coherence responses from various agents and accurately resolving the coherence for that address, the snoop pending table 108 sends the appropriate response including the necessary data to the source of the transactions. While the coherence for a given address is being resolved at the snoop pending table 108, other incoming transactions with conflicting addresses are held in the pending request buffer 106 until the coherence for the prior transaction is completely resolved.

Memory RAS operations such as mirroring involve keeping two copies of data for every memory address at all times. Memory RAS operations such as memory migration involve copying a portion of the memory data to spare memory or another section of memory when required.

When mirroring is disabled only one copy of the memory data exists in memory. The first (or only) copy is referred to as the "primary copy" or "primary memory", for example. The second copy is referred to as "secondary copy" or "mirrored copy" or "mirrored memory" for example.

Making a copy of memory data involves generating an additional memory write to a different memory address. For this reason, memory write transactions are the transactions that are primarily affected by the memory RAS operations. For example, in mirroring memory read transactions coming into any memory agent are generally processed exactly the same way with or without mirroring, unless the memory read from the primary address results in erroneous data. In such cases an additional memory read to the mirrored location is generated to obtain the correct data. On the other hand, memory write transactions generate an additional memory write transaction to a different memory address (the mirrored address) when mirroring is enabled, and only one memory write transaction is generated to the primary address (that is, the address involved in the transaction) when mirroring is disabled.

In some embodiments the mirroring engine 112 (or mirror write pending table MWPT 112) is a mechanism for transparent mirror operations. It is similar to the snoop pending table 108. In some embodiments the MWPT can be part of the snoop pending table 108. Mirroring engine 112 keeps track of pending mirror transactions from local and/or remote memory agents. The mirroring engine 112 keeps track of all pending mirroring transactions for writes (and reads). All mirror write transactions are queued in a mirror write queue (MWRQ) and tracked until completion. The mirroring engine 112 keeps the order of mirror write transactions in case of address conflicts. Mirroring engine 112 resolves address conflicts among mirror write/read transactions as follows. If there is an address conflict, the conflicting transaction is queued into a pending write mirror queue (PMWRQ). When the conflicting transaction completes, the pending transaction is moved to the MWRQ. In this manner, write ordering to the same address is preserved. Mirroring engine 112 also enables the receipt of mirror transactions and dispatch thereof directly to the memory interface. The memory interface response is directly forwarded to the source.

In some embodiments a copy engine is included within the mirroring engine 112. In some embodiments the mirroring engine 112 is the copy engine. In some embodiments the copy engine is not included in the mirroring engine 112. In some embodiments the copy engine is included in the processor memory interface 114. In some embodiments the copy engine is a hardware device. In some embodiments the copy engine is a software and/or firmware device. The copy engine is used to generate the additional memory writes and/or reads required to track the completion of the transactions required during memory RAS operations (for example, during mirroring operations). The mirroring engine 112 hosts the copy engine, and can include additional hardware to perform memory RAS operations such as sparing, mirroring and/or migration.

In some embodiments the memory associated with a particular copy engine may be hot pluggable. In some embodiments the CPU/chipset component associated with a particular copy engine may be hot pluggable. In such a case after a hot plug, mirroring is re-enabled for the hot plugged unit, and the new mirror must be in sync with the current primary. Therefore, all data from the current primary needs to be copied to the new mirror. The copy may be accomplished by a memory read from the primary followed by a write to the mirror. For example, every primary DIMM (Dual In-Line Memory Module) location is copied to a hot plugged mirror location, which may involve multiple memory regions. The copy process co-exists with memory reads and/or writes to primary memory. The reads and/or writes from other agents interleave at the home node with the reads/writes from the copy process. If the copy process cannot guarantee atomicity (that is, the process completing without any interruptions) inconsistent memory data may result for memory that is not coherent or is not cached. Therefore, a coherence mechanism alone may not be able to resolve all coherency issues, so a copy synchronization scheme is used to guarantee atomicity.

All local memory read/write transactions are forwarded to the mirroring engine 112 by the snoop pending table 108. Memory read transactions are directly forwarded to primary memory by the mirroring engine 112 via the processor memory interface 114. If the data from the primary memory location is error-free it is directly forwarded to the snoop pending table 108. If the data is erroneous a new memory read is generated to the mirrored memory. If the data from the mirrored memory is error-free it is then forwarded to the snoop pending table 108. If the data from the mirrored memory is not error free error handling mechanisms are invoked (for example, ECC, etc.)

Memory write transactions arriving at the mirroring engine 112 are duplicated and queued into a memory write queue (MWRQ) if there are no address conflicts with any other entries within the MWRQ. In some embodiments the MWRQ is included within the mirroring engine 112. If an address conflict is found within the MWRQ the new memory write transaction is buffered in a pending memory write queue (PMWRQ). In some embodiments the PMWRQ is included within the mirroring engine 112.

The memory write queue (MWRQ) is necessary where the interconnect fabric is unordered. The MWRQ may be used to serialize memory read/write transactions with address conflicts in order to preserve coherence. The MWRQ enables the snoop pending table 108 to respond to the source of a write transaction without waiting for a mirrored write completion. The MWRQ also releases any requirement of the snoop pending table 108 to serialize the mirrored transactions.

Figure 2:
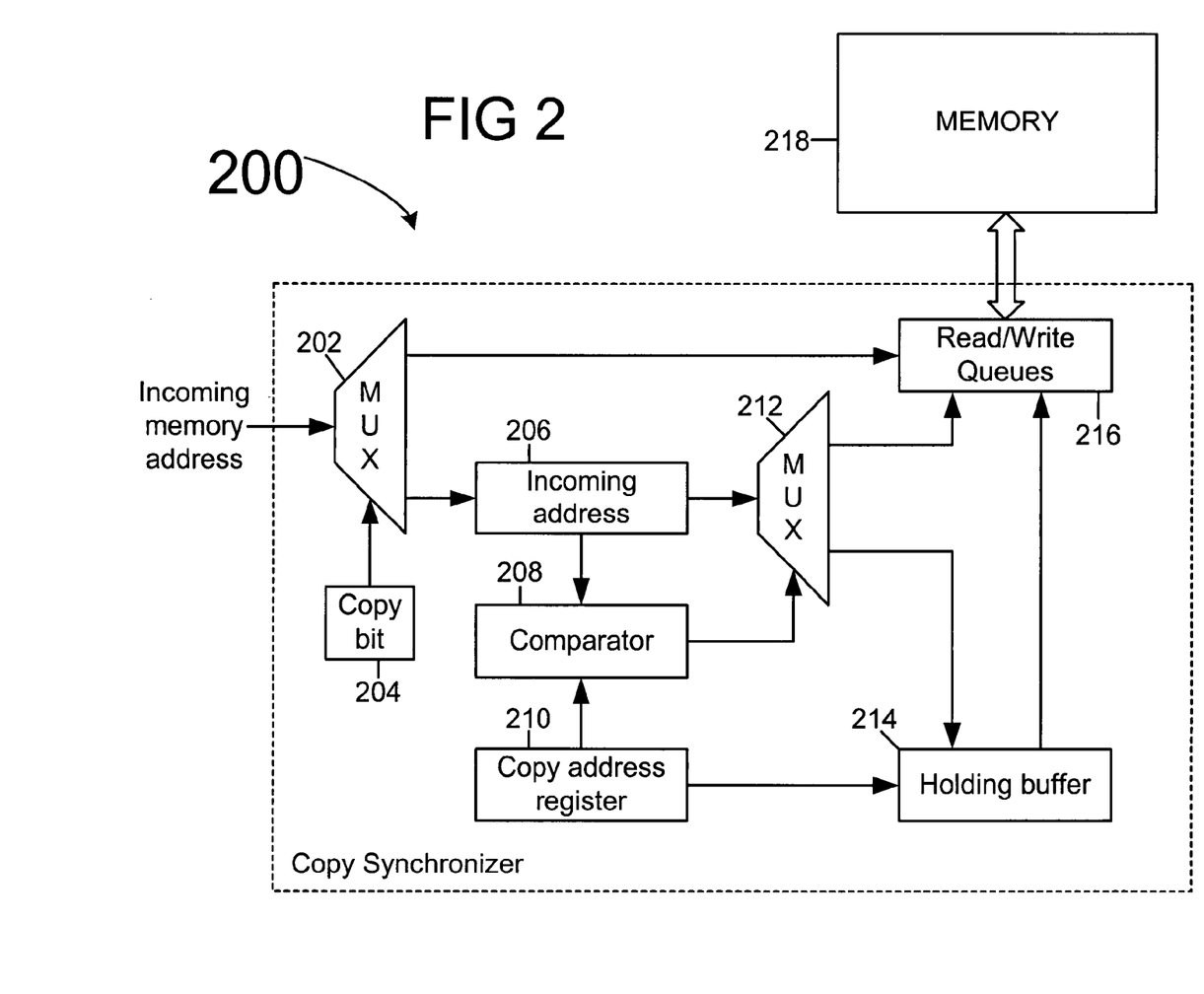
FIG. 2 is a block diagram illustrating a copy engine according to some embodiments of the inventions.

FIG. 2 illustrates a block diagram of a copy synchronizer apparatus 200 according to some embodiments. The copy synchronizer 200 includes a multiplexer (MUX) 202, a copy bit register 204, an incoming address register 206, a comparator 208, a copy address register 210, a multiplexer (MUX) 212, a holding buffer 214 and read/write queues 216. In some embodiments the copy synchronizer apparatus 200 is included in a mirroring engine (or mirror write pending table) such as mirroring engine 112 of FIG. 1. In some embodiments the copy synchronizer 200 is included in a memory interface such as processor memory interface 114 of FIG. 1. In some embodiments the copy engine is provided as a separate device that may be coupled to a mirroring engine such as mirroring engine 112 and/or coupled to a memory interface such as processor memory interface 114 of FIG. 1. In some embodiments the read/write queues 216 are not included in the copy synchronizer 200. In some embodiments the read/write queues 216 are part of a memory interface such as processor memory interface 114 of FIG. 1. In some embodiments the copy synchronizer 200 is coupled (directly or indirectly through some other device such as a memory interface) to memory 218 (for example, main memory).

While the copy process of a copy engine (for example, a software copy process) is on the copy bit in the copy bit register 204 is set. During the copy process the current address that is being copied is written in the copy address register 210, preferably before the read/write process begins. In some embodiments, the read/write process is implemented by the software controlling the copy operation. If the copy bit is not set in the copy bit register 204 then the incoming memory address is forwarded through multiplexer 202 to the read/write queues 216.

When the copy bit is set in copy bit register 204 the incoming memory address is forwarded through multiplexer 202 to the incoming address register 206. Thus, while the copy bit is set in the copy bit register 204 all incoming memory addresses are compared to the address in the copy address register 210 using comparator 208. If the addresses in incoming address register 206 and copy address register 210 are the same as a result of the comparison by comparator 208, the incoming memory address is stored temporarily in the holding buffer 214. This may be accomplished by providing the output of comparator 208 to a select line of multiplexer 212 such that the incoming address in the incoming address register 206 is provided to the holding buffer 214 when the addresses in the incoming address register 206 and the copy address register 210 are the same, and the incoming address in the incoming address register 206 is provided to the read/write queues 216 when the addresses in the incoming address register 206 and the copy address register 210 are not the same. Additionally, in some embodiments a bit may be set in the holding buffer 216 when the incoming address is temporarily stored therein. This bit is a bit that indicates a conflict has occurred. When the copy for the conflicted address is complete, the conflict bit in the holding buffer 214 is reset and the memory transaction at the holding buffer is allowed to proceed to the read/write queues 216 (in some embodiments the read/write queues are included within a memory interface, whether or not the other elements of the copy synchronizer 200 are included in the memory interface). When the conflicting transaction is held in the holding buffer 214 as described above all other transactions that have no conflict proceed directly to read/write queues 216. In the manner described above in reference to FIG. 2, atomicity of the copy operation can be guaranteed.

In some embodiments a software controlled copy operation may be implemented for memory RAS features. The copy synchronizer described and illustrated in FIG. 2 allows cost-effective copy engines for memory migration implementation (for example, in mid-end to high-end server platforms). A full copy engine in hardware may add to the development and testing costs of the component substantially. Additionally, hardware development resources required to implement RAS features may be reduced, thereby minimizing any impact on schedule and time to market (TTM).

Although some embodiments have been described herein as working well with software copy engines, hardware copy engines for copying data from one memory device to a spare device may also be used for implementing memory RAS features. However, software mechanisms for copying data can reduce design and/or development resources required in hardware schemes. These could be substantial, depending on the complexity of the RAS flow. In any case, some embodiments that perform copy operations with synchronization can reduce validation complexity and resources, particularly in the context of multiprocessor cache coherence protocols.

Figure 3:
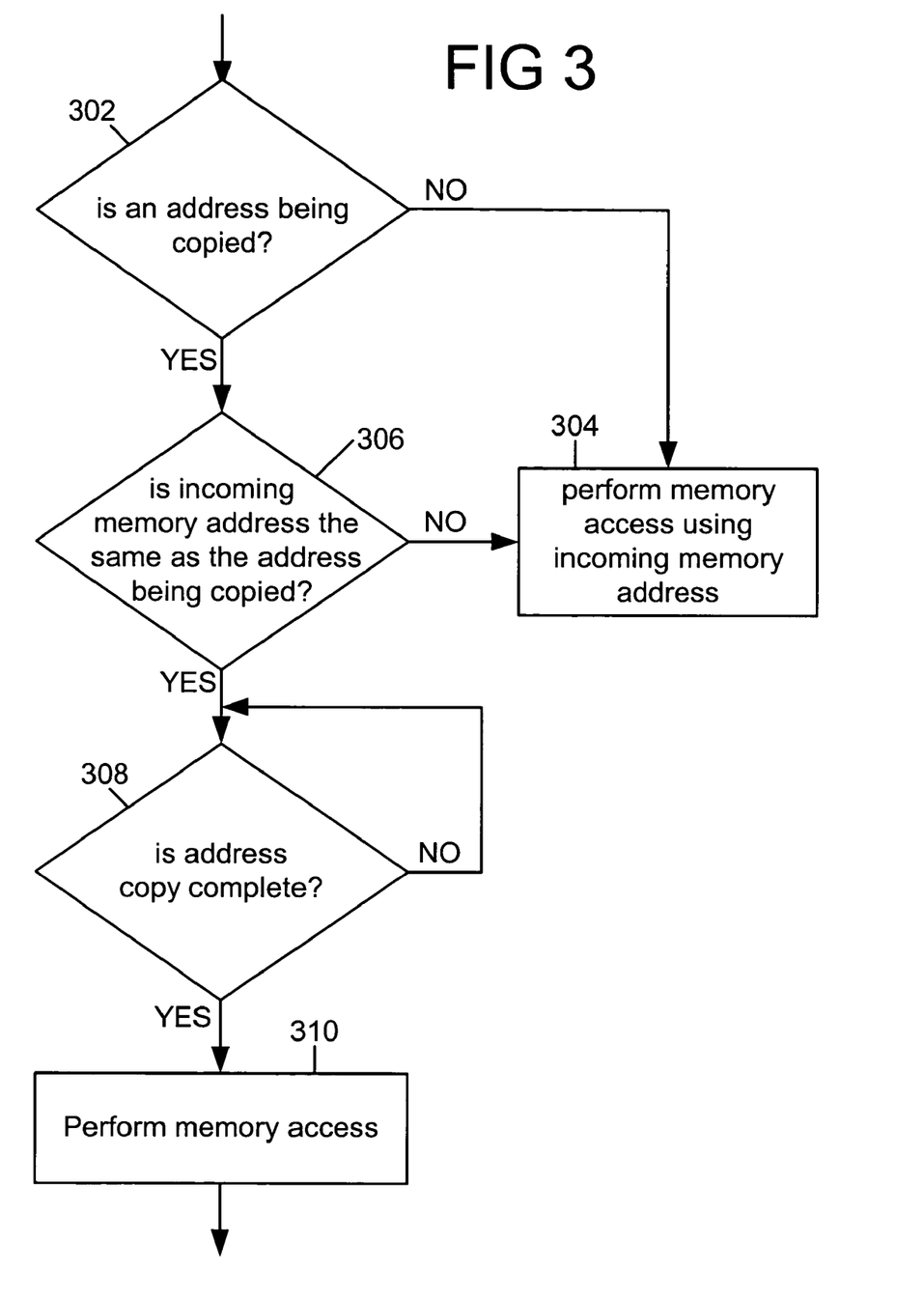
FIG. 3 illustrates a flow diagram according to some embodiments of the inventions.

FIG. 3 illustrates a flow diagram according to some embodiments. At 302 a determination is made as to whether or not an address is being copied. If an address is not being copied then a memory access using the incoming memory address is performed at 304. If an address is being copied then a determination is made at 306 as to whether the incoming memory address is the same as the address currently being copied. If the incoming memory address is not the same as the address currently being copied then a memory access is performed at 304 using the incoming memory address. If the incoming memory address is the same as the address currently being copied then a determination is made at 308 as to whether the address copy operation has been completed. In some embodiments the incoming memory address may be stored prior between 306 and 308 (for example, stored in a register). Operation stays at 308 until the address copy operation has been completed. Once the address copy operation has been completed then a memory access using the incoming memory address is performed at 310. In some embodiments the incoming memory address is obtained from wherever the incoming memory address was stored between 306 and 308.

In some embodiments, a copy process bit is set when the copy process begins. Then the address being copied is written in a copy address register. Once an incoming memory address has been received then the incoming memory address is compared to the address stored in the copy address register. If the incoming address is different than the address stored in the copy address register then the incoming address is allowed to proceed to read/write queues in a memory interface coupled to a memory. If the incoming address is the same as the address stored in the copy address register then the incoming memory address is stored in a holding buffer (and a conflict bit in the holding buffer is set). Once the copy has been completed then the conflict bit in the holding buffer is reset and the memory transaction stored in the holding buffer is allowed to proceed to the read/write queues.

Figure 4:
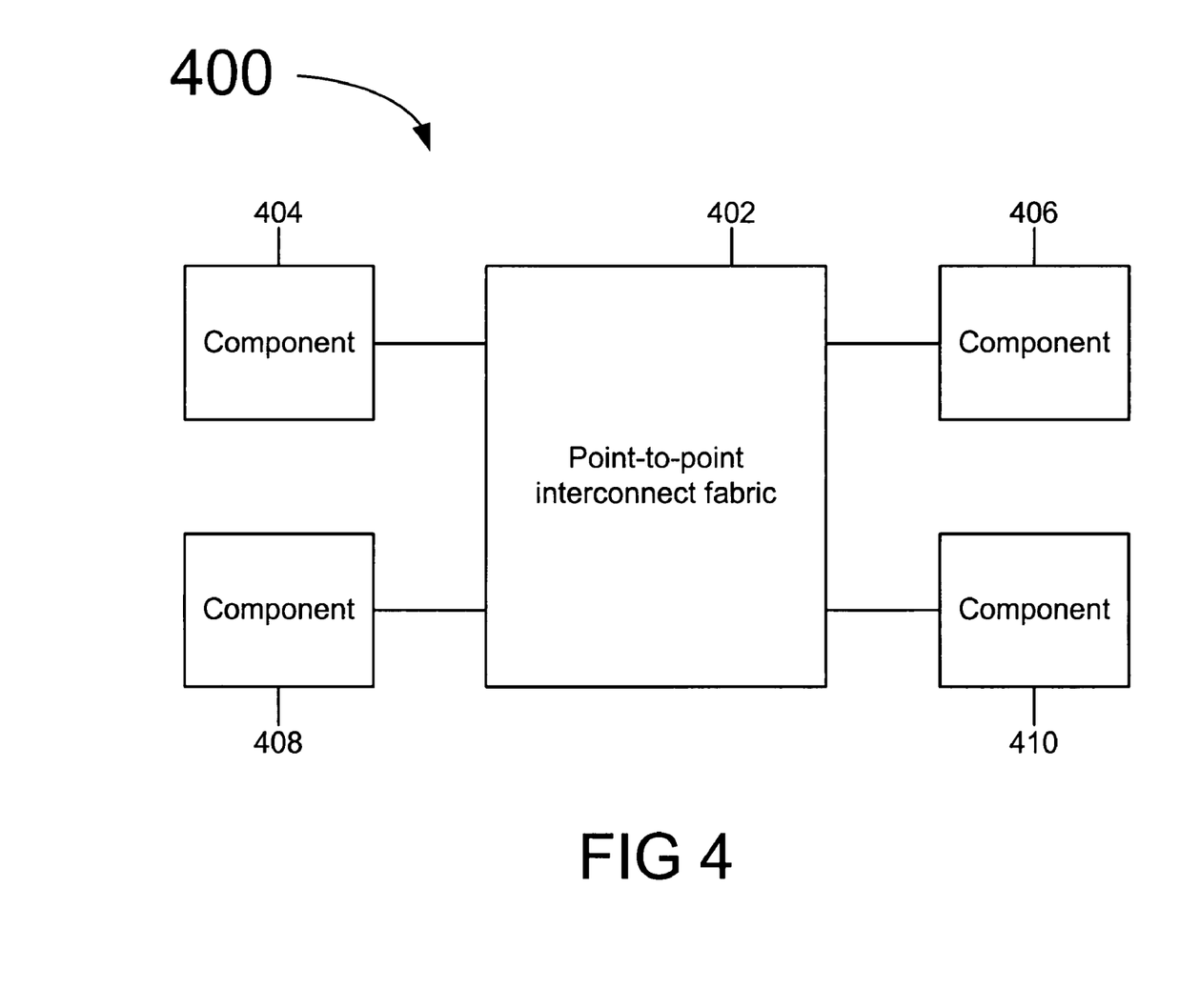
FIG. 4 illustrates a system according to some embodiments of the inventions.

FIG. 4 illustrates a system 400 according to some embodiments. System 400 includes a point-to-point interconnect fabric 402, a component 404, a component 406, a component 408 and a component 410. Although four components 404, 406, 408 and 410 are illustrated in FIG. 4 any number of components may be used in systems according to some embodiments. In some embodiments fabric 402 is a point-to-point coherent interconnect used as a system interconnect fabric. In some embodiments system 400 may be a server system. In some embodiments each of components 404, 406, 408 and 410 may be one or more of the following components: a processor, a memory controller (integrated or external), I/O device, memory, etc.

Each of the components 404, 406, 408 and 410 may include distributed logic and/or distributed decision making used to perform memory RAS operations. For example, each or some of the components of FIG. 4 can include various features, hardware, logic, etc. of the memory RAS operations described in reference to FIG. 1. Each of the components 404, 406, 408 and 410 may include a copy engine for RAS operations, which may be performed in hardware, software, firmware, etc. Each of the components 404, 406, 408 and 410 may also include (or have coupled thereto) a copy synchronization mechanism. The copy synchronization mechanism in any of the components 404, 406, 408 and 410 may be similar to the copy synchronizer apparatus 200 described in reference to and illustrated in FIG. 2.

Although most of the embodiments described above have been described in reference to particular implementations such as memory mirroring or memory migration, other implementations are possible according to some embodiments. For example, the implementations described herein may be used to implement memory RAID over coherent interconnects, memory migration, Operating System transparent migration (with spares) over coherent interconnects, mirroring across hot pluggable units over coherent interconnects (for example, where the memory and/or memory controller are hot pluggable), memory RAID over hot pluggable units, and/or memory sparing, etc. according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state, or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
a comparator to compare an incoming memory address with a memory address currently being copied by a memory copy operation;
a holding buffer to hold the incoming address prior to forwarding it to a memory read/write queue if the incoming memory address is the same as the memory address currently being copied by the memory copy operation, and to forward the buffered incoming memory address to the read/write queue once the memory copy operation for the memory address currently being copied has finished; and
a first multiplexer with an input coupled to the incoming memory address and a select input coupled to a signal indicating whether the memory copy operation is occurring, the first multiplexer having a first output to forward the incoming memory address to the read/write queue if no memory copy operation is occurring and a second output to forward the incoming memory address to a first input of the comparator if a memory copy operation is occurring.

2. The apparatus according to claim 1, further comprising a second multiplexer with a first input coupled to the second output of the first multiplexer and a select input coupled to an output of the comparator, the second multiplexer having a first output to forward the incoming memory address to the read/write queue if the incoming memory address is not the same as the memory address currently being copied by the memory copy operation and having a second output to forward the incoming memory address to the holding buffer if the incoming memory address is the same as the memory address currently being copied by the memory copy operation.

3. The apparatus according to claim 1, further comprising a register coupled to the second output of the first multiplexer and to the first input input of the comparator to store the incoming memory address.

4. The apparatus according to claim 2, further comprising a register coupled to the second output of the first multiplexer, to the first input of the second multiplexer, and to the first input of the comparator to store the incoming memory address.

5. The apparatus according to claim 1, further comprising a register to store the incoming memory address and coupled to a first input of the comparator.

6. The apparatus according to claim 1, further comprising a register to store the signal indicating whether the memory copy operation is occurring.

7. The apparatus according to claim 1, further comprising a register to store the memory address currently being copied by the memory copy operation.

8. An apparatus comprising:
a comparator to compare an incoming memory address with a memory address currently being copied by a memory copy operation;
a holding buffer to hold the incoming address prior to forwarding it to a memory read/write queue if the incoming memory address is the same as the memory address currently being copied by the memory copy operation, and to forward the buffered incoming memory address to the read/write queue once the memory copy operation for the memory address currently being copied has finished; and
a multiplexer with a first input coupled to the incoming address signal and a select input coupled to an output of the comparator, the multiplexer having a first output to forward the incoming memory address to the read/write queue if the incoming memory address is not the same as the memory address currently being copied by the memory copy operation and having a second output to forward the incoming memory address to the holding buffer if the incoming memory address is the same as the memory address currently being copied by the memory copy operation.

9. The apparatus according to claim 8, further comprising a register coupled to the first input of the multiplexer to store the incoming memory address.

10. A system comprising:
an unordered interconnect; and
at least two components coupled to the interconnect, at least two of the at least two components including:
a comparator to compare an incoming memory address with a memory address currently being copied by a memory copy operation; and
a holding buffer to hold the incoming address prior to forwarding it to a memory read/write queue if the incoming memory address is the same as the memory address currently being copied by the memory copy operation, and to forward the buffered incoming memory address to the read/write queue once the memory copy operation for the memory address currently being copied has finished;
the at least two of the at least two components further including a first multiplexer with an input coupled to the incoming memory address and a select input coupled to a signal indicating whether the memory copy operation is occurring, the first multiplexer having a first output to forward the incoming memory address to the read/write queue if no memory copy operation is occurring and a second output to forward the incoming memory address to a first input of the comparator if a memory copy operation is occurring.

11. The system according to claim 10, the at least two of the at least two components further including a second multiplexer with a first input coupled to the second output of the first multiplexer and a select input coupled to an output of the comparator, the second multiplexer having a first output to forward the incoming memory address to the read/write queue if the incoming memory address is not the same as the memory address currently being copied by the memory copy operation and having a second output to forward the incoming memory address to the holding buffer if the incoming memory address is the same as the memory address currently being copied by the memory copy operation.

12. The system according to claim 10, the at least two of the at least two components further including a multiplexer with a first input coupled to the incoming address signal and a select input coupled to an output of the comparator, the multiplexer having a first output to forward the incoming memory address to the read/write queue if the incoming memory address is not the same as the memory address currently being copied by the memory copy operation and having a second output to forward the incoming memory address to the holding buffer if the incoming memory address is the same as the memory address currently being copied by the memory copy operation.

* * * * *